(12) United States Patent (10) Patent No.: US 7,777,234 B2
Nishimura et al. (45) Date of Patent: Aug. 17, 2010

(54) LIGHT-RECEIVING ELEMENT AND PHOTONIC SEMICONDUCTOR DEVICE PROVIDED THEREWITH

(75) Inventors: Susumu Nishimura, Tottori (JP); Shoji Honda, Tottori (JP); Koji Ueyama, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 1526 days.

(21) Appl. No.: 10/380,861

(22) PCT Filed: Sep. 27, 2001

(86) PCT No.: PCT/JP01/08481
§ 371 (c)(1), (2), (4) Date: Mar. 18, 2003

(87) PCT Pub. No.: WO02/29904
PCT Pub. Date: Apr. 11, 2002

(65) Prior Publication Data
US 2003/0173569 A1 Sep. 18, 2003

(30) Foreign Application Priority Data
Sep. 29, 2000 (JP) ............................. 2000-298651
Dec. 19, 2000 (JP) ............................. 2000-385598
May 28, 2001 (JP) ............................. 2001-159229

(51) Int. Cl.
*H01L 27/15* (2006.01)

(52) U.S. Cl. .............................. 257/80; 257/81; 257/82; 257/83; 372/50.1; 372/54; 385/14

(58) Field of Classification Search .................. 372/50, 372/54, 14; 385/14; 257/81, 82, 80, 83
See application file for complete search history.

(56) References Cited

U.S. PATENT DOCUMENTS 6,414,388 B1 * 7/2002 Moriyama .................. 257/724

FOREIGN PATENT DOCUMENTS

EP 0 284 212 A 9/1988

(Continued)

OTHER PUBLICATIONS

An English translation of International Search Report for PCT/JP01/08481 maield on Oct. 30, 2001.

(Continued)

*Primary Examiner*—Lynne A Gurley
*Assistant Examiner*—Samuel A Gebremariam
(74) *Attorney, Agent, or Firm*—McDermott Will & Emery LLP

(57) ABSTRACT

A light-receiving element has a photodiode formed in part of the top surface of a semiconductor substrate so as to function as a light-receiving region, and has a light-emitting element mount electrode formed on top of the semiconductor substrate where the light-receiving region is not formed. A high concentration impurity layer is formed below the top surface of the semiconductor substrate along the peripheral edges of the light-emitting element mount electrode. This helps prevent the voltage applied to the light-emitting element mount electrode from influencing the output of the light-receiving element.

Alternatively, a photonic semiconductor device has a light-emitting element and a light-receiving element, and has the light-receiving region of the light-receiving element formed parallel to the direction in which the light-emitting element emits light. The light-emitting element is arranged so that, when viewed in a plan view, the light-emitting point thereof overlaps with at least part of the light-receiving region. This permits easy fitting of the light-emitting element even with a low light-emitting point, and thus helps reduce variation in light reception sensitivity.

16 Claims, 11 Drawing Sheets

FOREIGN PATENT DOCUMENTS

| | | | |
|---|---|---|---|
| JP | 63-164264 | A1 | 10/1988 |
| JP | 63-237492 | A1 | 10/1988 |
| JP | 63-253690 | A1 | 10/1988 |
| JP | 02-138778 | A1 | 5/1990 |
| JP | 02-084358 | A1 | 6/1990 |
| JP | 05-063309 | A1 | 3/1993 |
| JP | 07-045912 | A1 | 2/1995 |
| JP | 08-213641 | A1 | 8/1996 |

OTHER PUBLICATIONS

International Preliminary Examination Report (Japanese) completed on Feb. 22, 2002.

European Search Report issued in European Patent Application No. EP 01972551 dated Feb. 4, 2009.

\* cited by examiner

LIGHT-RECEIVING ELEMENT AND PHOTONIC SEMICONDUCTOR DEVICE PROVIDED THEREWITH

TECHNICAL FIELD

The present invention relates to a light-receiving element suitable for monitoring an optical output from a device, such as a light-emitting diode or semiconductor laser for optical communication, that outputs light of a single wavelength, and to a photonic semiconductor device provided with such a light-receiving element.

BACKGROUND ART

Conventional photonic semiconductor devices, as represented by semiconductor lasers, are provided with a light-receiving element for monitoring the optical output of a light-emitting element, and the voltage applied to the light-emitting element is controlled based on the level of light detected by the light-receiving element so as to keep the optical output of the light-emitting element constant. FIG. 17 is a sectional view showing an example of a conventional photonic semiconductor device. In the photonic semiconductor device shown in FIG. 17, an n-type low concentration impurity layer ($n^-$ layer) 6 is laid on top of an n-type high concentration impurity layer ($n^+$ layer) 5 to form a silicon substrate 2, and, just below the top surface of part of this silicon substrate 2, a diffusion layer ($p^+$ layer) 6 diffused with a p-type impurity such as boron is formed to form a PIN-type photodiode, which functions as a light-receiving element 1. On the top surface of the silicon substrate 2, an insulating layer 8 of silicon oxide or the like is formed. Moreover, on top of the insulating layer 8, above the top surface of the silicon substrate 2 where the diffusion layer 3 is not formed, a light-emitting element mount electrode 10 is formed, on which a light-emitting element 18 is fixed with a conductive adhesive B such as Ag paste (see, for example, the publication of Japanese Patent Application Laid-Open No. H6-53603).

The conventional photonic semiconductor device structured as described above have been suffering from unwanted influence of electric charge, such as that produced by the voltage applied to the light-emitting element mount electrode 10, on the output of the light-receiving element 1.

Moreover, it has been suffering also from variation of the output Im of the light-receiving element 1 according to variation of the height H from the top surface of the insulating layer 8 to the light-emitting point (active layer) 18b of the light-emitting element 18. FIG. 18 shows the relationship between the height H and the output current Im of the light-receiving element 18. This diagram shows, for H=10 μm and 130 μm, the relationship between the distance L from the light-emitting point 18b of the light-emitting element to the light-receiving region 4 and the output current Im. When the height H equals 130 μm (solid line), the output current Im of the light-receiving element is constant irrespective of the distance L from the light-emitting point to the light-receiving regions; by contrast, when the height H equals as low as 10 μm (broken line), the output current Im of the light-receiving element decreases sharply as the distance L increases. On the other hand, to permit the heat produced at the light-emitting point to be rejected effectively through the semiconductor substrate, the light-emitting element needs to have as small a height H as possible. Thus, fitting the light-emitting element with the distance L as close to zero as possible has customarily been requiring high accuracy.

Furthermore, quite inconveniently, light-emitting elements based on gallium nitride or the like are prone to be destroyed by static electricity accumulated on a worker during the fabrication of devices incorporating them.

DISCLOSURE OF THE INVENTION

An object of the present invention is to provide a light-receiving element whose output is not influenced by, for example, a voltage applied to an electrode on which a light-emitting element is mounted, and to provide a photonic semiconductor device provided with such a light-receiving element.

Another object of the present invention is to provide a photonic semiconductor device that permits easy fitting of a light-emitting element even with a low light-emitting point and that suffers from little variation in light reception sensitivity.

Still another object of the present invention is to provide a photonic semiconductor device that prevents destruction of a light-emitting element by static electricity during its fabrication.

To achieve the above objects, according to a first embodiment (claim 1) of the present invention, a light-receiving element has a photodiode formed in part of the top surface of a semiconductor substrate so as to function as a light-receiving region and has a light-emitting element mount electrode formed on top of the semiconductor substrate where the light-receiving region is not formed. In addition, a high concentration impurity layer is formed below the top surface of the semiconductor substrate along the peripheral edges of the light-emitting element mount electrode in such a way that, when viewed in a plan view, there is either a partial or no overlap between the high concentration impurity layer and the light-emitting element mount electrode.

Here, it is also possible to form an insulating layer on the top surface of the semiconductor substrate both where the light-receiving region is formed and where the light-receiving region is not formed, and form the light-emitting element mount electrode on top of the insulating layer. For better rejection of heat, it is also possible to form the light-emitting element mount electrode above a through hole formed in the insulating layer so that the electrode makes direct contact with the semiconductor substrate through the through hole.

According to a second embodiment (claim 4) of the present invention, a light-receiving element has a photodiode formed in part of the top surface of a semiconductor substrate so as to function as a light-receiving region and has a light-emitting element mount electrode formed on top of the semiconductor substrate where the light-receiving region is not formed. In addition, the light-emitting element mount electrode is formed so as to make contact with a low concentration impurity layer of the photodiode, and a high concentration impurity layer is formed below the top surface of the semiconductor substrate along the peripheral edges of the light-emitting element mount electrode.

Here, for better productivity and lower costs, it is also possible to form the high concentration impurity layer only along the edge facing the light-receiving region.

According to a third embodiment (claim 7) of the present invention, a photonic semiconductor device has a photodiode formed in part of the top surface of a semiconductor substrate so as to function as a light-receiving region, has a light-emitting element mount electrode formed on top of the semiconductor substrate where the light-receiving region is not formed, and has a light-emitting element mounted on the light-emitting element mount electrode. In addition, a high concentration impurity layer is formed below the top surface of the semiconductor substrate along the peripheral edges of the light-emitting element mount electrode in such a way that, when viewed in a plan view, there is either a partial or no overlap between the high concentration impurity layer and the light-emitting element mount electrode.

According to a fourth embodiment (claim 9) of the present invention, a photonic semiconductor device has a photodiode formed in tart of the top surface of a semiconductor substrate so as to function as a light-receiving region, has a light-emitting element mount electrode formed on top of the semiconductor substrate where the light-receiving region is not formed, and has a light-emitting element mounted on the light-emitting element mount electrode. In addition, the light-emitting element mount electrode is formed so as to make contact with a low concentration impurity layer of the photodiode, and a high concentration impurity layer is formed below the top surface of the semiconductor substrate along peripheral edges of the light-emitting element mount electrode.

Here, for better rejection of heat, it is also possible to form an insulating layer on the top surface of the semiconductor substrate both where the light-receiving region is formed and where the light-receiving region is not formed, and form the light-emitting element mount electrode above a through hole formed in the insulating layer so that the electrode makes direct contact with the semiconductor substrate through the through hole. For easy fitting of the light-emitting element and for reduction of variation in light reception sensitivity, it is preferable to form the light-receiving region of the light-receiving element parallel to the direction in which the light-emitting element emits light, and arrange the light-emitting element in such a way that, when viewed in a plan view, its light-emitting point overlaps with at least part of the light-receiving region. The light-emitting element is, preferably, a semiconductor laser, and the height from the top surface of the light-receiving element to the light-emitting point of the light-emitting element is, preferably, 120 μm or less.

According to a fifth embodiment (claim 14) of the present invention, a photonic semiconductor device has an insulating layer formed on top of a semiconductor substrate, has a photodiode formed in part of the top surface of the semiconductor substrate so as to function as a light-receiving region, has a though hole formed in the insulating layer where the light-receiving region is not formed, has a light-emitting element mount electrode formed so as to make direct contact with the semiconductor substrate through the through hole, has a light-emitting element mounted on the light-emitting element mount electrode, and has a high concentration impurity layer formed below the surface of the semiconductor substrate along the peripheral edges of the light-emitting element mount electrode. In addition, the resistance of the semiconductor substrate is higher than the operating-state resistance of the light-emitting element, and, of two surface electrodes formed on the light-emitting element, the one that does not make contact with the light-emitting element mount electrode is kept at an identical potential with a bottom surface electrode of the semiconductor substrate. Here, the resistance of the semiconductor substrate is, preferably, in the range of from 50 to 15,000Ω.

According to a sixth embodiment (claim 15) of the present invention, a photonic semiconductor device has an insulating layer formed on top of a semiconductor substrate, has a photodiode formed in part of the top surface of the semiconductor substrate so as to function as a light-receiving region, has a though hole formed in the insulating layer where the light-receiving region is not formed, has a light-emitting element mount electrode formed so as to make direct contact with the semiconductor substrate through the through hole, has a light-emitting element mounted on the light-emitting element mount electrode, has the light-receiving region of the light-receiving element formed parallel to the direction in which the light-emitting element emits light, and has the light-emitting element arranged in such a way that, when viewed in a plan view, the light-emitting point thereof overlaps with at least part of the light-receiving region. In addition, the resistance of the semiconductor substrate is higher than the operating-state resistance of the light-emitting element, and, of two surface electrodes formed on the light-emitting element, the one that does not make contact with the light-emitting element mount electrode is kept at an identical potential with a bottom surface electrode of the semiconductor substrate. Here, the resistance of the semiconductor substrate is, preferably, in the range of from 50 to 15,000Ω.

BEST MODE FOR CARRYING OUT THE INVENTION

Figure 1:
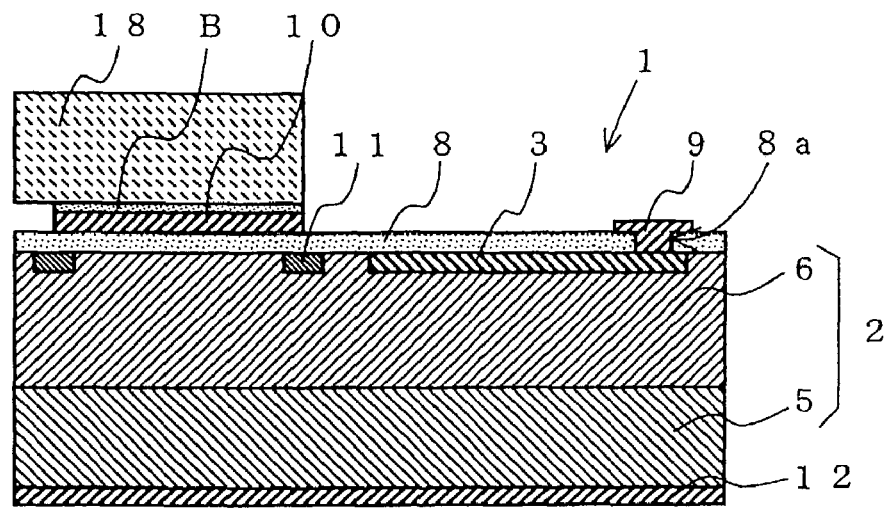
FIG. 1 is a vertical sectional view showing an example of the light-receiving element and the photonic semiconductor device of a first and a third embodiment of the invention.
Figure 2:
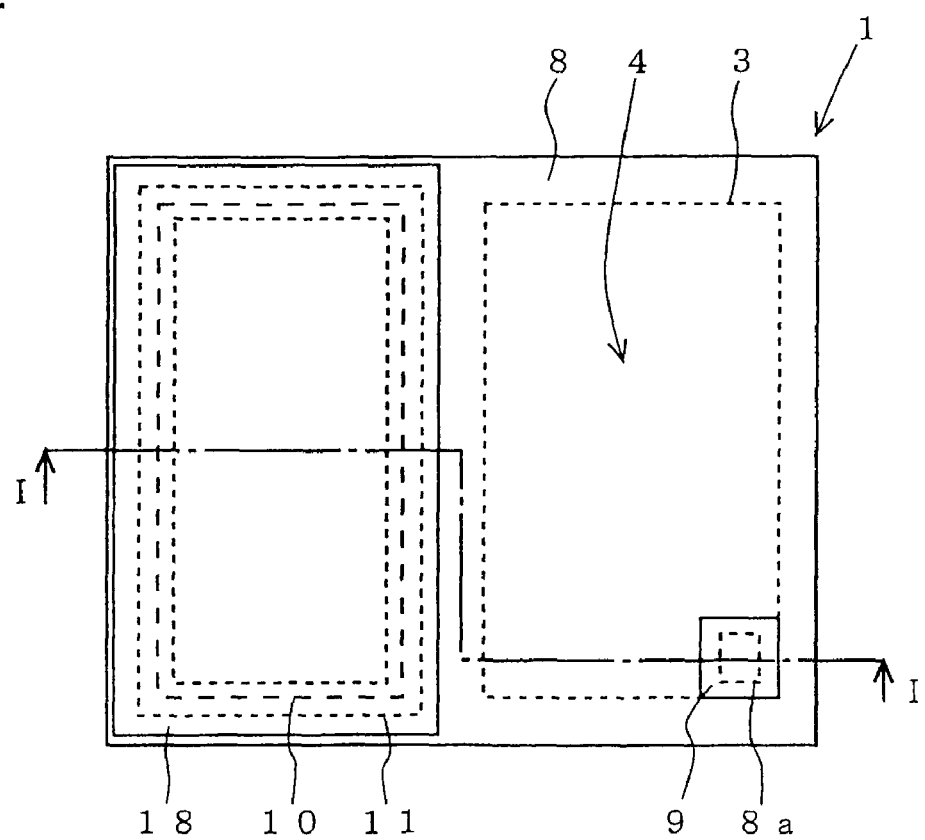
FIG. 2 is a plan view of the photonic semiconductor device shown in FIG. 1.

First, the light-receiving element and the photonic semiconductor device of a first and a third embodiment of the invention will be described with reference to the drawings. FIG. 1 is a vertical sectional view (along line I-I shown in FIG. 2) of an example of the light-receiving element and the photonic semiconductor device of the first and third embodiments, and FIG. 2 is a plan view thereof.

In the light-receiving element 1 shown in FIG. 1, an n-type low concentration impurity layer ($n^-$ layer) 6 is laid on top of an n-type high concentration impurity layer ($n^+$ layer) 5 diffused with an n-type impurity such as a phosphorus to form a silicon substrate (semiconductor substrate) 2, and, just below the top surface of part of the silicon substrate 2, a high concentration impurity layer ($p^+$ layer) 3 doped with a p-type impurity such as boron is formed to form a PIN-type photodiode. Here, the portion where the p-type impurity layer 3 is formed functions as a light-receiving region 4 (shown in FIG. 2).

In addition all along the peripheral edges of the region allocated for a light-emitting element mount electrode (referred to as the "mount electrode" also) 10 that is to be formed on top of the silicon substrate 1 where the light-receiving region 4 is not formed, an n-type high concentration impurity layer 11 is formed by selectively diffusing an n-type impurity such as phosphorus below the top surface of the silicon substrate 2 (see FIG. 2). The impurity concentration of this impurity layer is, preferably, as high as or higher than that of the impurity layer 3. The conductivity type of the high concentration impurity layer 11 formed along the peripheral edges of the mount electrode 10 may be either p- or n-type.

Figure 3:
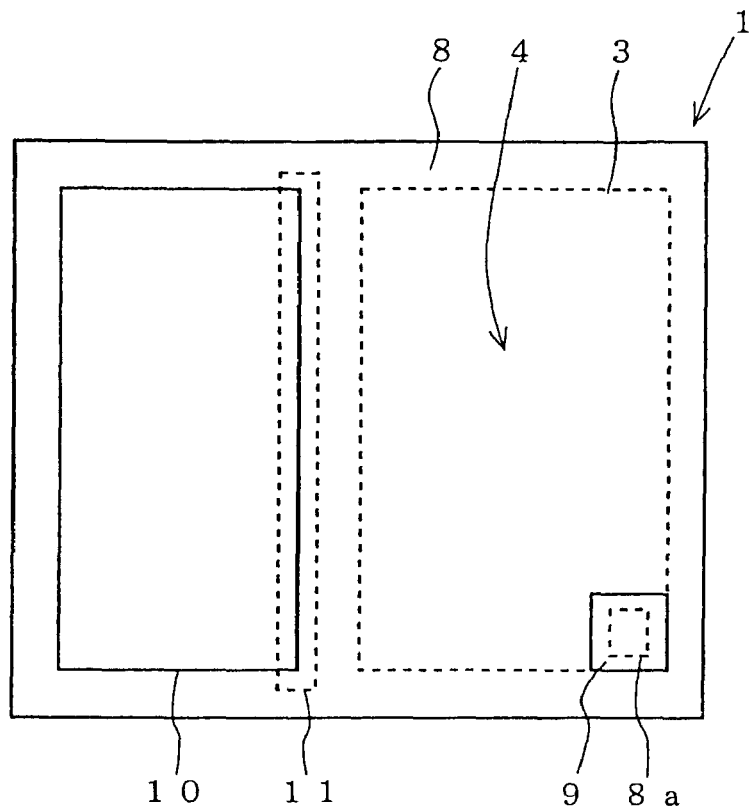
FIG. 3 is a plan view showing another example of the light-receiving element of the first embodiment.
Figure 19:
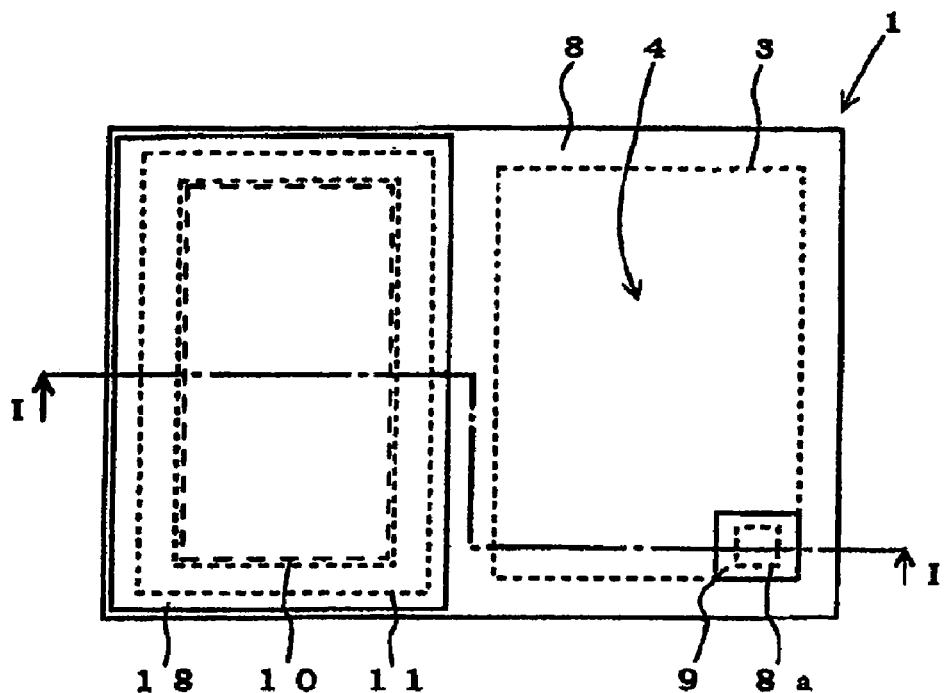
FIG. 19 is a plan view showing another example of the light-receiving element of the first embodiment.
Figure 20:
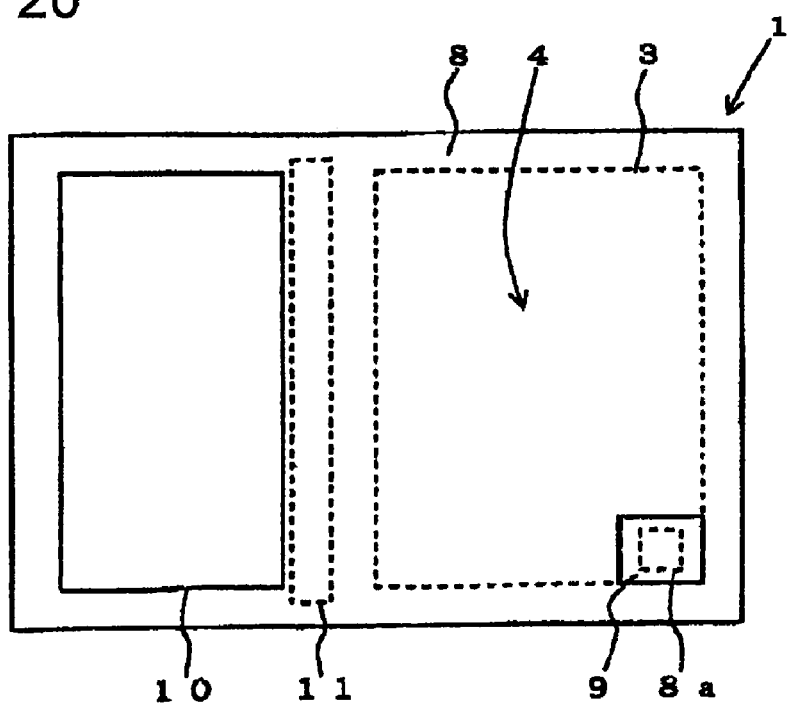
FIG. 20 is a plan view showing another example of the light-receiving element of the first embodiment.

As shown in FIG. 3, the high concentration impurity layer 11 may be formed along only part of the peripheral edges of the mount electrode 10, specifically only along the edge facing the light-receiving region 4. In FIG. 1, the high concentration impurity layer 11, when viewed in a plan view, is partially covered by the mount electrode 10 and is partially uncovered. However, as long as it is located substantially between the mount electrode 10 and the light-receiving region 4, the high concentration impurity layer 11, when viewed in a plan view, may be exposed completely out of the mount electrode 10, as shown in FIG. 19 and FIG. 20.

In FIG. 1, on the top surface of the silicon substrate 2, an insulating film 8 of silicon oxide or the like is formed for surface protection and reflection prevention. To extract a signal from the light-receiving region 4 (shown in FIG. 2), a through hole 8a is formed in the insulating film 8 above the light-receiving region 4, then a metal such as aluminum is vapor-deposited on top and then the unnecessary portion of the metal is removed by photolithography to form a signal electrode 9 that makes contact with the p-types impurity layer 3. When the metal is deposited on the insulating film 8 and the unwanted portion of the metal is removed, the mount electrode 10 is simultaneously formed on the insulating film 8 where the light-receiving region 4 is not formed. On the bottom surface of the silicon substrate 2, a bottom surface electrode 12 of gold or the like is formed.

Then, on the mount electrode 10 thus formed on the light-receiving element 1, a light-emitting element 18 is fixed with a conductive adhesive B such as Ag paste.

In this photonic semiconductor device, the high concentration impurity layer 11 is formed between the mount electrode 10 and the light-receiving region 4, and therefore the unwanted electric charge produced in the silicon substrate 2 by the voltage applied to the mount electrode 10 is effectively absorbed by the high concentration impurity layer 11. This helps reduce the influence of the unwanted electric charge on the output appearing at the signal electrode 9, and thereby minimize its adverse effect on the illuminance-to-output current characteristic of the light-receiving element 1. Moreover, the distance between the light-receiving region 4 and the mount electrode 10 can be made shorter than conventionally needed. This helps miniaturize the external shape of the device.

The light-receiving element 1 shown in FIG. 1 is a PIN-type light-receiving element. Needless to say, however, the light-receiving element 1 may be a PN-type light-receiving element. It is also within the scope of the present invention to use the completely opposite combination of p- and n-type conductivity.

Figure 4:
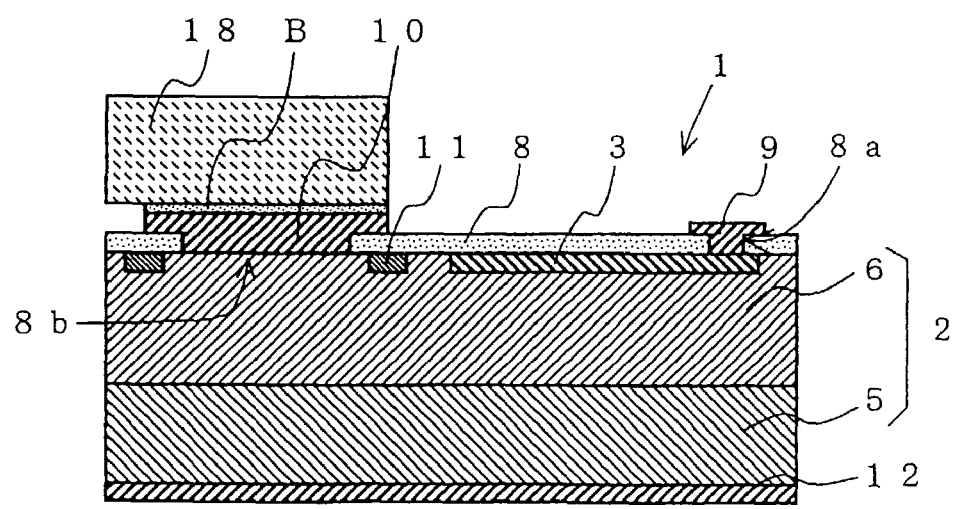
FIG. 4 is a vertical sectional view showing another example of the light-receiving element and the photonic semiconductor device of the invention.

FIG. 4 is a vertical sectional view showing another example of the light-receiving element and the photonic semiconductor device of the first embodiment. The device shown in FIG. 4 is characterized in that the mount electrode 10 is formed above a through hole 8b formed in the insulating film 8 so that the mount electrode 10 makes direct contact with the silicon substrate 2. This makes it possible to efficiently reject the heat produced by the light-emitting element 18 through the silicon substrate 2. In other respects, this device has the same structure as that shown in FIG. 1. Thus, the structure of this example is useful when the light-emitting element 18 used requires efficient heat rejection or when the insulating film 8 has low thermal conductivity.

Heretofore, only light-emitting elements that have surface electrodes on both of their top and bottom faces have been dealt with. Now, a description will be given of a case where a light-emitting element that has two surface electrodes on the same side is used. Examples of such light-emitting elements include light-emitting elements based on gallium nitride.

Figure 5:
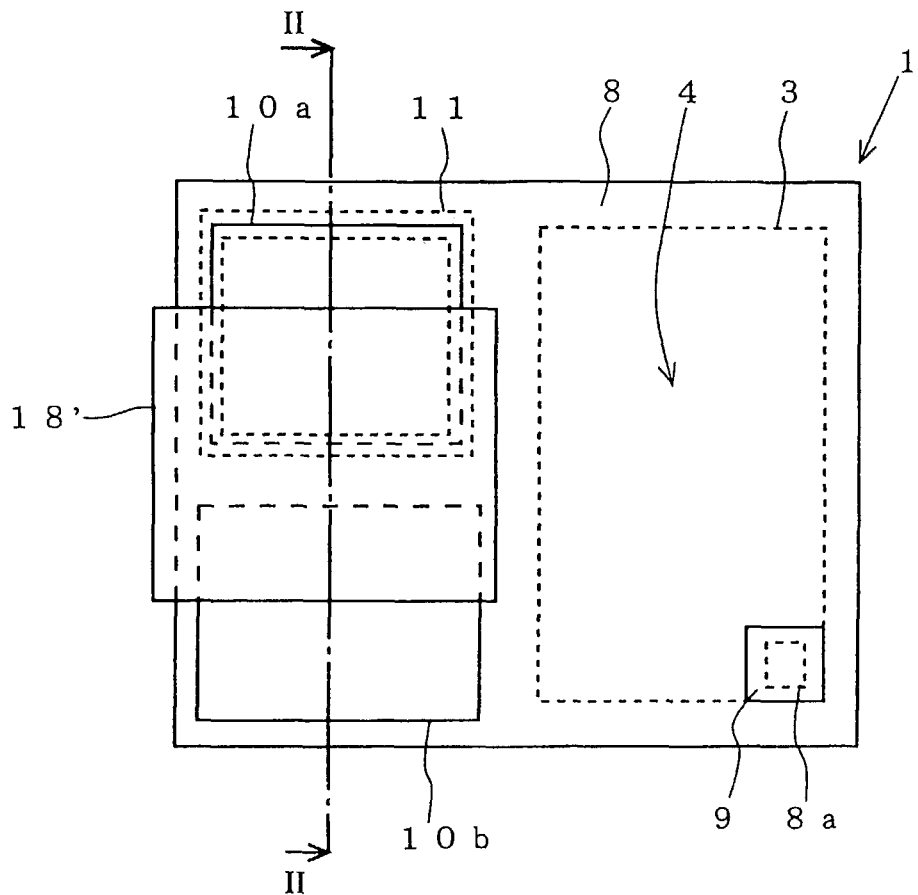
FIG. 5 is a plan view showing an example of the light-receiving element and the photonic semiconductor device of the invention incorporating a light-emitting element having two surface electrodes on the same side.
Figure 6:
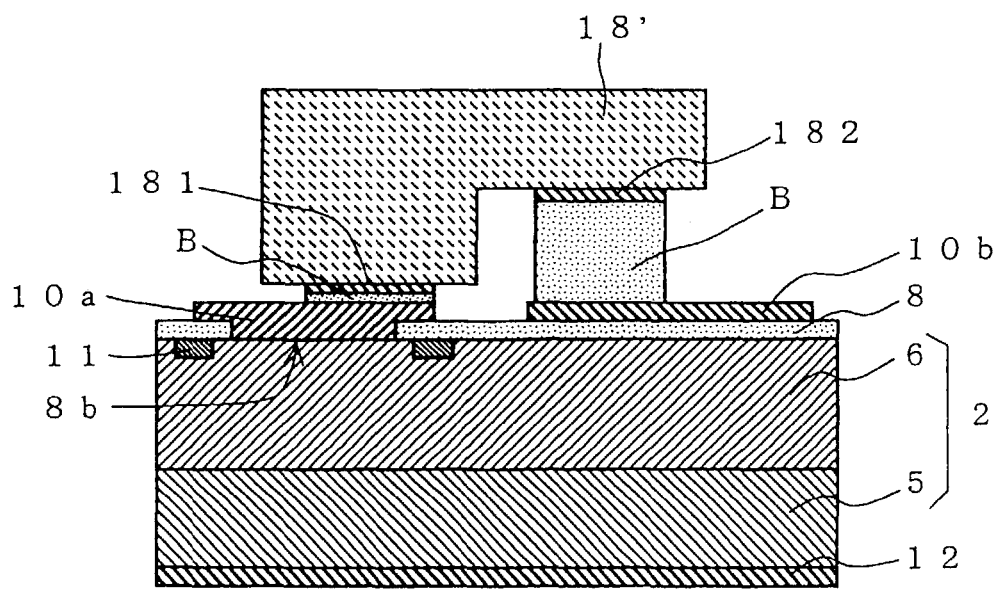
FIG. 6 is a sectional view along line II-II of the photonic semiconductor device shown in FIG. 5.

FIG. 5 is a plan view of a photonic semiconductor device incorporating a light-emitting element 18' having two surface electrodes on the same side, and FIG. 6 is a sectional view along line II-II shown in FIG. 5. This photonic semiconductor device differs from that shown in FIG. 4 in that two mount electrodes are formed on top of the insulating layer, and in other respects these two devices have basically the same structure.

In FIG. 6, of the two mount electrodes 10a and 10b formed on top of the insulating film 8, one (first mount electrode) 10a is formed above a through hole 8b formed in the insulating film 8 and makes direct contact with the silicon substrate 2 through the through hole 8b; the other (second mount electrode) 10b is formed on top of the insulating film 8 and does not make contact with the silicon substrate 2. The light-emitting element 18' is fixed with a conductive adhesive B so that its two surface electrodes 181 and 182 are connected to the first and second surface electrodes 10a and 10b, respectively.

Figure 7:
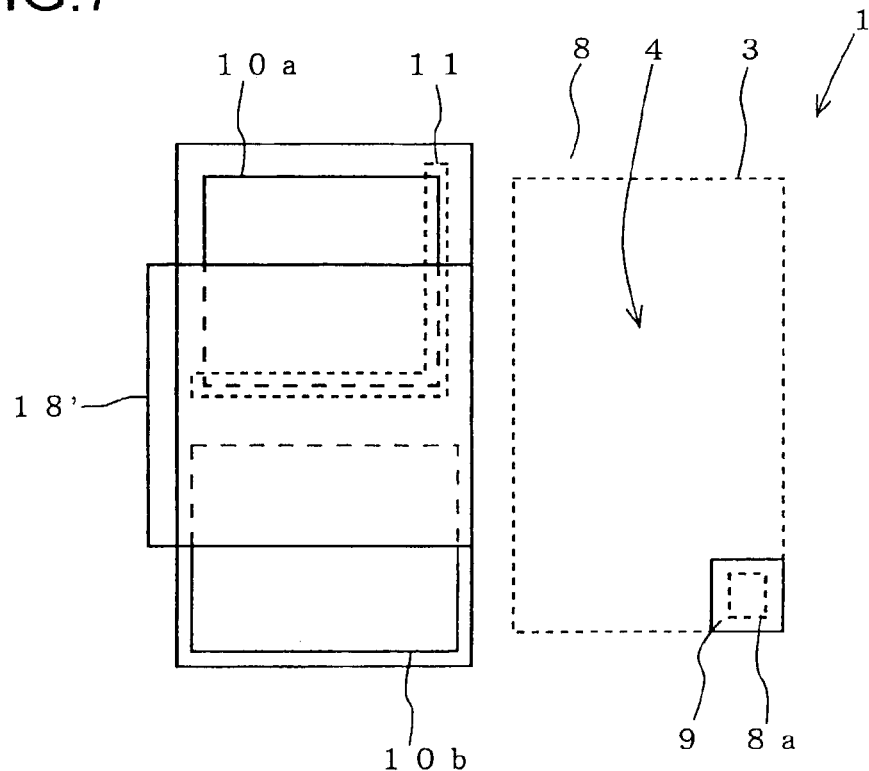
FIG. 7 is a plan view showing another example of the light-receiving element and the photonic semiconductor device of the first embodiment incorporating a light-emitting element having two surface electrodes on the same side.

In the photonic semiconductor device shown in FIG. 5, the high concentration impurity layer 11 is formed below the top surface of the silicon substrate 2 all along the peripheral edges of the first mount electrode 10a in such a way that when viewed in a plan view the high concentration impurity layer 11 partially overlaps with the first mount electrode 10. However, as shown in FIG. 7, the high concentration impurity layer 11 may be formed only along the edge of the first mount electrode 10a facing the light-receiving region 4.

Figure 8:
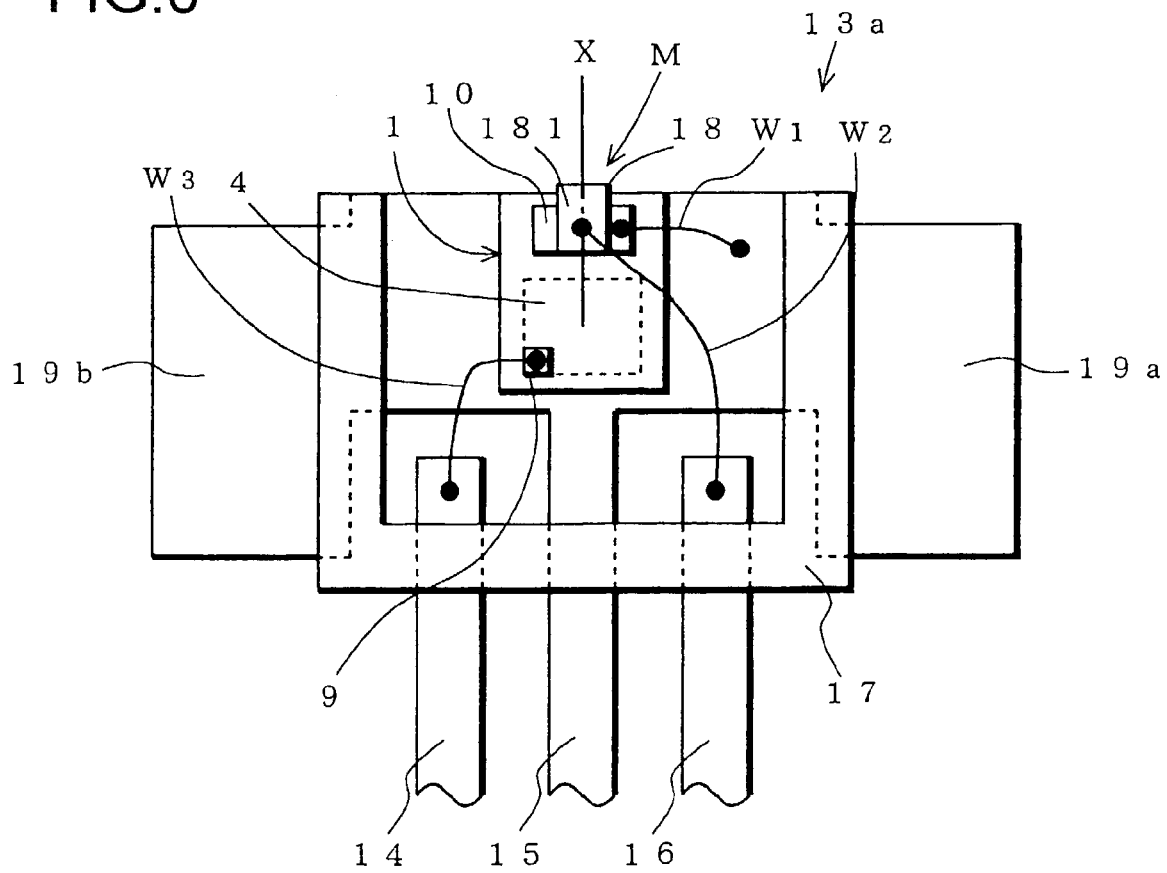
FIG. 8 is a plan view of the photonic semiconductor device of the invention mounted on a semiconductor laser.

FIG. 8 is a plan view of the photonic semiconductor device of a third embodiment of the invention mounted on a semiconductor laser device. Used as a light-emitting element here is a semiconductor laser element 18 having surface electrodes on both of its top and bottom faces.

In this semiconductor laser device 13a, on a package formed by coupling and fixing three leads 14, 15, and 16 to a resin frame 17, the photonic semiconductor device M shown in FIG. 4 is placed, which is then wired to the leads 14, 15, and 16 by wire bonding. The leads 14, 15, and 16 are formed out of a lead frame, and are composed of a main lead 15, of which the end is formed into a region on which to place the photonic semiconductor device M, and sub leads 14 and 16.

The main lead 15 has fins 19a and 19b formed integrally for heat rejection, which protrude rightward and leftward from the resin frame 17. The light-receiving element 1 is, at its bottom surface electrode 12 (shown in FIG. 4), fixed on the element placement region at the end of the main lead 15 with a conductive adhesive (not shown) such as Ag paste.

On the mount electrode 10 on the top surface of the light-receiving element 1, the semiconductor laser element 18 is fixed with a conductive adhesive B (shown in FIG. 4). In this way, the bottom surface electrode (not shown) of the semiconductor laser element 18 is electrically connected to the mount electrode 10. The exposed portion of the mount electrode 10 which is not covered by the semiconductor laser element 18 is connected to the main lead 15 with a bonding wire $W_1$.

Moreover, the top surface electrode 181 of the semiconductor laser element 18 is connected to the sub lead 16 with a bonding wire $W_2$, and the signal electrode 9 of the light-receiving element 1 is connected to the sub lead 14 with a bonding wire $W_3$.

In this semiconductor laser device 13a structured as described above, when a predetermined laser drive voltage is applied between the main lead 15 and the sub lead 16, the drive voltage is applied between the top and bottom surface electrodes of the semiconductor laser element 18, with the result that the semiconductor laser element 18 oscillates and emits laser light along an axis X. Part of the laser light emitted downward in the figure is incident on the light-receiving region 4 of the light-receiving element 1, causing a predetermined monitoring signal to appear at the signal electrode 9.

This signal is extracted from between the sub lead 14 and the main lead 15, and is then processed in a predetermined manner so that the voltage applied to the semiconductor laser element 18 is so controlled as to keep the optical output of the semiconductor laser element 18 constant.

Although a semiconductor laser element is used as the light-emitting element in the example described above, it is to be understood that the present invention applies to photonic semiconductor devices employing any other type of light-emitting element than a semiconductor laser element, such as an LED element.

In a case where a light-emitting element that is prone to be destroyed by a reverse voltage, such as a light-emitting element based on gallium nitride, is used, to protect the light-emitting element from static electricity (hereinafter referred to as a "surge" also) or the like during fabrication, it is preferable to structure the photonic semiconductor device and mount it on a light-emitting device in the following manner. Specifically, the resistance of the semiconductor substrate of the light-receiving element is made higher than the operating-state resistance of the light-emitting element. In addition, of the two surface electrodes formed on the light-emitting element, the one that is not connected to the mount electrode making contact with the semiconductor substrate is kept at an identical potential with the bottom surface electrode of the semiconductor substrate, further preferably both at the ground potential.

Figure 9:
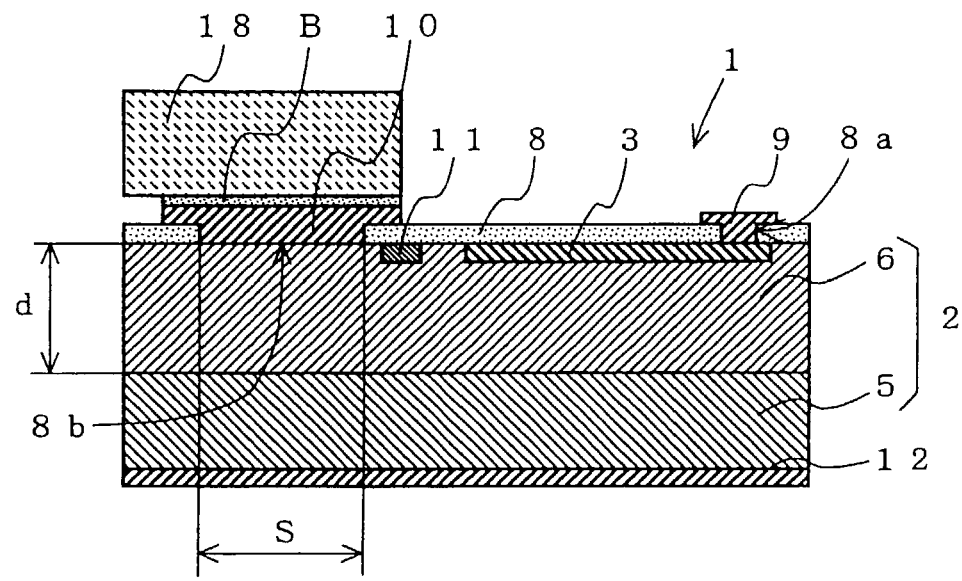
FIG. 9 is a vertical sectional view showing another example of the light-receiving element and the photonic semiconductor device of the invention.
Figure 10:
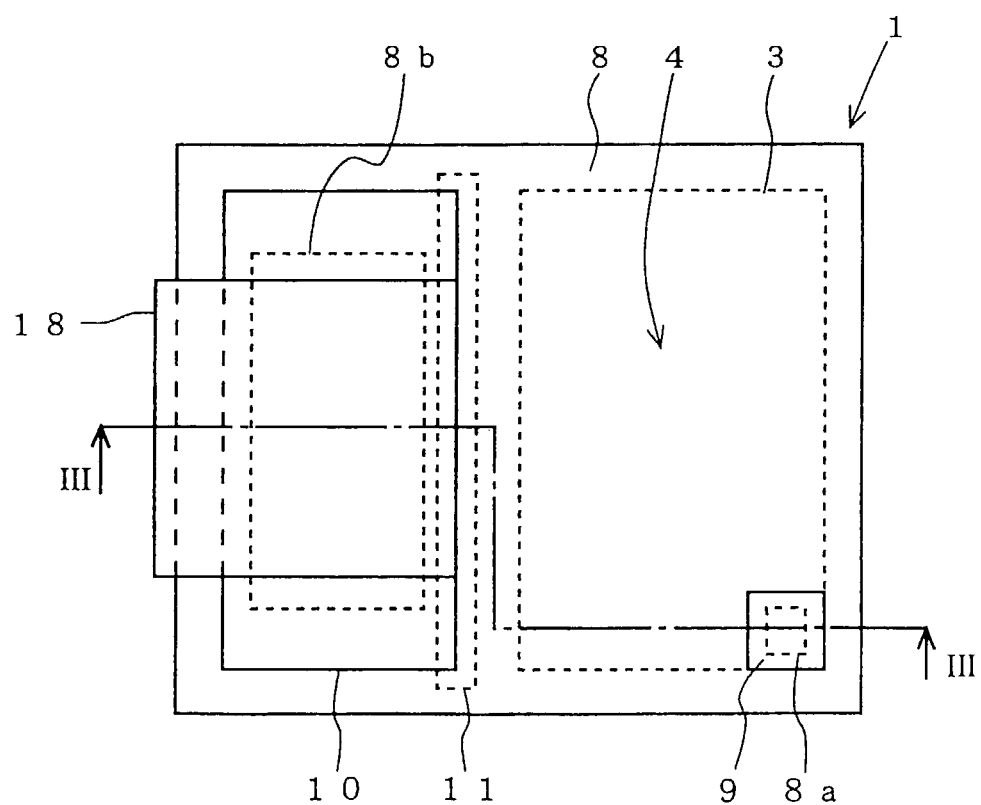
FIG. 10 is a plan view of the photonic semiconductor device shown in FIG. 9.

First, the structure of such a photonic semiconductor device will be described. FIGS. 9 and 10 are a side sectional view and a plan view, respectively, of the photonic semiconductor device. In these figures, the apparent difference from the device shown in FIG. 4 is that the high concentration impurity layer 11 is formed partially, that is, only along the edge of the mount electrode 10 facing the light-receiving region 4. The substantial difference, on the other hand, is that the resistance R from the bottom surface of the mount electrode 10 to the bottom surface of the n-type low concentration impurity layer (n⁻ layer) 6 is made higher than the operating-state resistance of the light-emitting element 18 (the resistance of the high concentration impurity layer 5 is so low that it can be ignored here).

The resistance R of the n-type low concentration impurity layer 6 is given by the equation shown below. Accordingly, the resistance R can be adjusted so as to be higher than the operating-state resistance of the light-emitting element by varying the area S over which the mount electrode 10 makes direct contact with the impurity layer 6, the thickness d of the impurity layer 6, and the specific resistance k of the impurity layer 6.

$$R = k \times (d/S) \quad (1)$$

Figure 11:
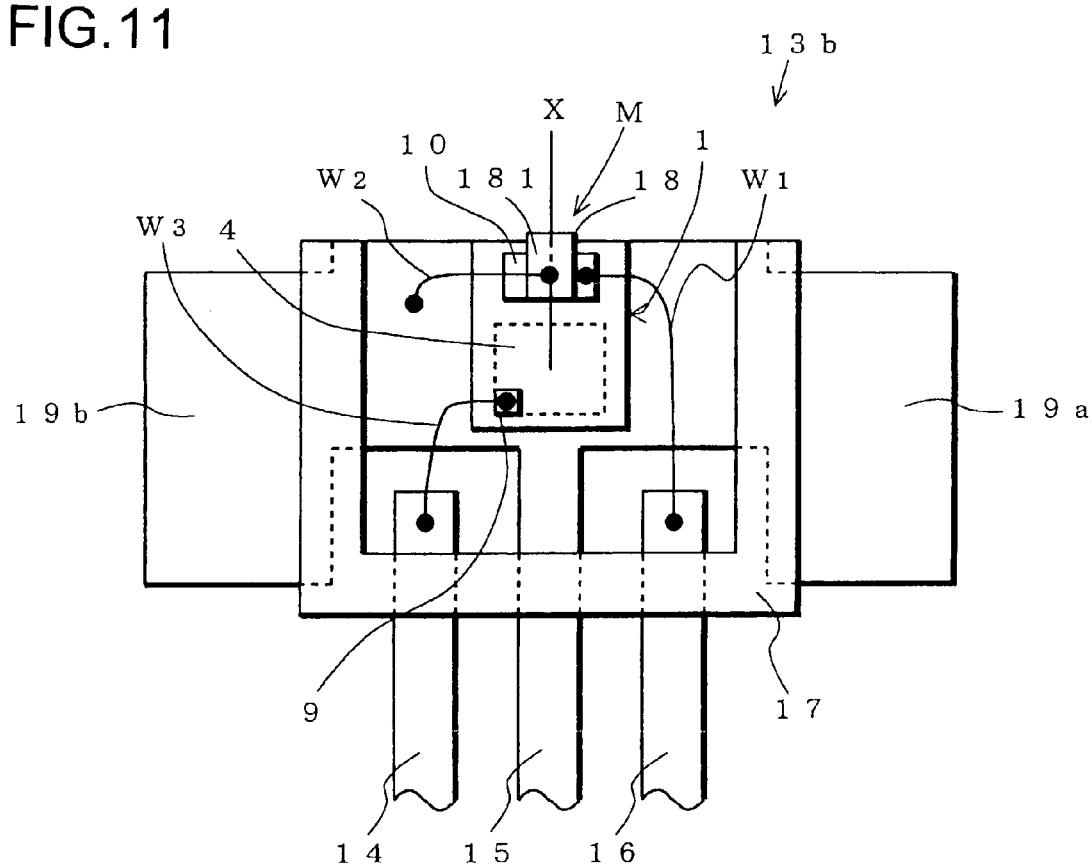
FIG. 11 is another plan view of the photonic semiconductor device of the first embodiment mounted on a semiconductor laser.

Next, how this photonic semiconductor device is mounted on a light-emitting device will be described. FIG. 11 is a plan view of the photonic semiconductor device M described above mounted on a semiconductor laser device. This semiconductor laser device 13b has basically the same structure as the device shown in FIG. 8, and therefore the explanations common to these two devices will be omitted. Now, the differences from the device shown in FIG. 8, namely the wiring between the electrodes, will be described.

The exposed portion of the mount electrode 10 which is not covered by the light-emitting element 18 is connected to the sub lead 16 with a bonding wire $W_1$. The top surface electrode 181 of the light-emitting element 18 is connected to the main lead 15 with a bonding wire $W_2$. The signal electrode 9 of the light-receiving element 1 is connected to the sub lead 14 with a bonding wire $W_3$.

In this semiconductor laser device 13b structured as described above, two current path circuits are formed. One runs from the sub lead 16 to the bonding wire $W_1$, then to the mount electrode 10, then to the light-emitting element 18, then to the top surface electrode 181, then to the bonding wire $W_2$, and then to the main lead 15, forming a first current path circuit. The other runs from the sub lead 16 to the bonding wire $W_1$, then to the mount electrode 10, then to the low concentration impurity layer 6 (shown in FIG. 9) of the light-receiving element 1, then to the high concentration impurity layer 5 (shown in FIG. 9) of the light-receiving element 1, then to the bottom surface electrode 12 (shown in FIG. 9), and then to the main lead 15, forming a second current path circuit.

When a predetermined current or predetermined laser drive voltage is fed in the forward direction between the main lead 15 and the sub lead 16, since the resistance R of the n-type low concentration impurity layer 6 is higher than the operating-state resistance of the light-emitting element 18, the current flows through the first current path circuit. Thus, the light-emitting element 18 oscillates and emits laser light along an axis X.

By contrast, when static electricity or the like causes a voltage to be applied in the reverse direction between the main lead 15 and the sub lead 16, the current flows mainly through the second current path circuit. This prevents destruction of the light-emitting element 18.

Figure 12:
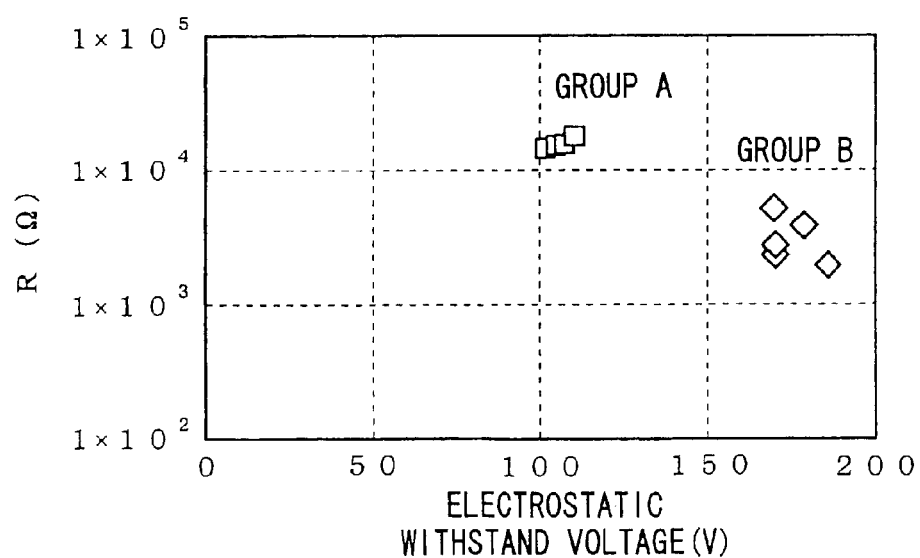
FIG. 12 is a diagram showing the relationship between the resistance R of the semiconductor substrate and the electrostatic withstand voltage of the light-emitting element.

FIG. 12 shows the relationship between the resistance R of the n-type low concentration impurity layer 6 and the electrostatic withstand voltage of the semiconductor laser element in the semiconductor laser device. When the resistance R is about 16,000Ω, the electrostatic withstand voltage is about 100 V (group A in the figure); when the resistance R is about 5,000Ω, the electrostatic withstand voltage is about 170 V (group B in the figure). Thus, this diagram shows that, the lower the resistance R, the higher the electrostatic withstand voltage. In general, light-emitting elements are expected to withstand an electrostatic voltage of 120 V or higher, though depending on the type, and therefore a preferred upper limit of the resistance R is 15,000Ω. On the other hand, if the resistance R is lower than the operating-state resistance of the light-emitting element, more current flows through the second current circuit and disables the light-emitting element from emitting light. Therefore, a preferred lower limit of the resistance R is 50Ω.

In a case where a light-emitting element having two surface electrodes on the same side is used in the photonic semiconductor device, it is advisable to wire the electrodes in the following manner to protect the light-emitting element from a surge. It is to be noted that the photonic semiconductor device used here is the device shown in FIG. 6 and that the resistance R from the bottom surface of the first mount electrode 10a to the bottom surface of the n-type low concentration impurity layer 6 is made higher than the operating-state resistance of the light-emitting element 18' (the resistance of the high concentration impurity layer 5 is so low that it can be ignored here).

Figure 13:
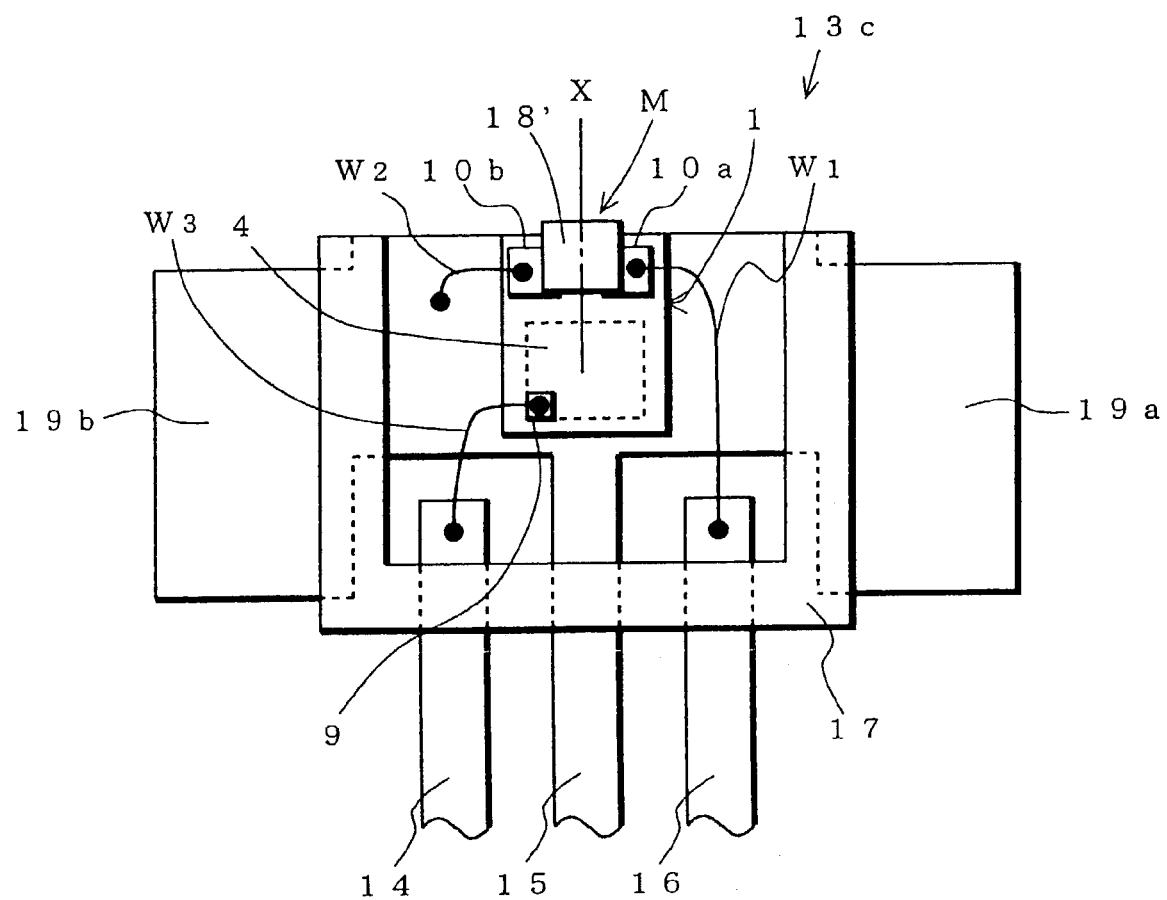
FIG. 13 is a plan view of the photonic semiconductor device of the invention, incorporating a light-emitting element having two surface electrodes on the same side, mounted on a semiconductor laser.

FIG. 13 is a plan view of this photonic semiconductor device mounted on a semiconductor laser device. The exposed portion of the first mount electrode 10a which is not covered by the semiconductor laser element 18' is connected to the sub lead 16 with a bonding wire $W_1$. The second mount electrode 10b is connected to the main lead 15 with a bonding wire $W_2$. The signal electrode 9 is connected to the sub lead 14 with a bonding wire $W_3$.

As in the previous example, in the semiconductor laser device 13c, as a result of the electrodes being wired in this way, two current path circuits are formed. One runs from the sub lead 16 to the bonding wire $W_1$, then to the first mount electrode 10a, then to the semiconductor laser element 18', then to the second mount electrode 10b, then to the bonding wire $W_2$, and then to the main lead 15, forming a first current path circuit. The other runs from the sub lead 16 to the bonding wire $W_1$, then to the first mount electrode 10a, then to the low concentration impurity layer 6 (shown in FIG. 6) of the light-receiving element 1, then to the high concentration impurity layer 5 (shown in FIG. 6) of the light-receiving element 1, then to the bottom surface electrode 12 (shown in FIG. 6), and then to the main lead 15, forming a second current path circuit.

As a result of this wiring, as in the previous example, when a predetermined current or predetermined laser drive voltage is fed in the forward direction between the main lead 15 and the sub lead 16, the current flows through the first current path circuit. Thus, the semiconductor laser element 18' oscillates and emits laser light along an axis X. By contrast, when static electricity or the like causes a voltage to be applied in the reverse direction between the main lead 15 and the sub lead 16, the current flows mainly through the second current path circuit. This prevents destruction of the semiconductor laser element 18'.

Next, the photonic semiconductor device of claim 11 of the invention will be described with reference to the drawings.

Figure 14:
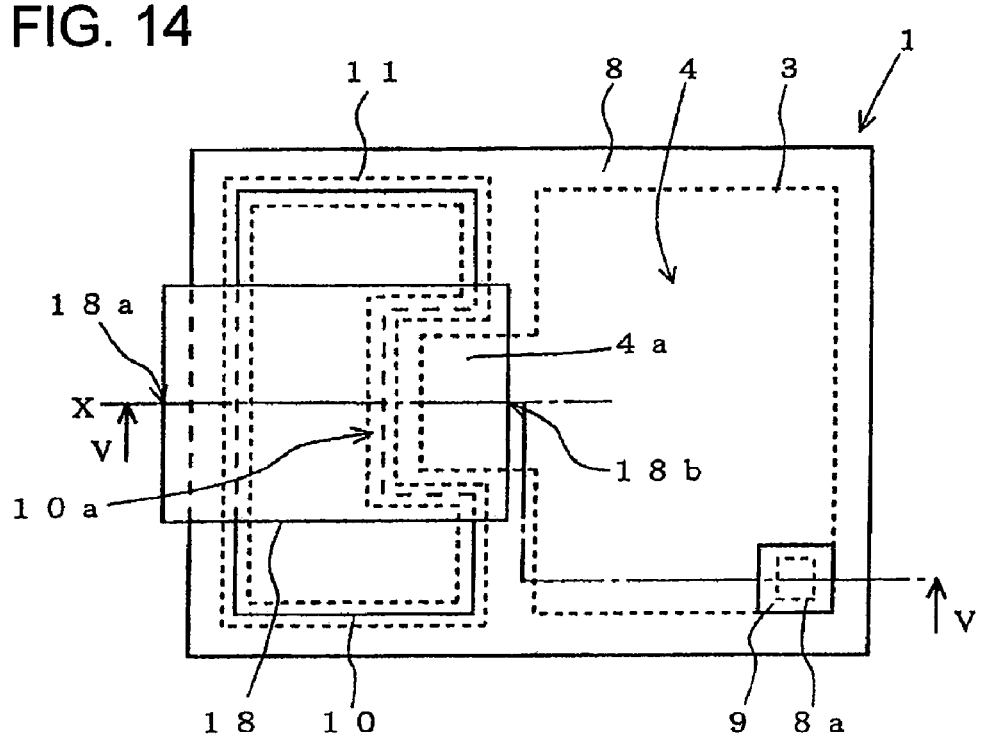
FIG. 14 is a plan view showing another example of the photonic semiconductor device of claim 11 of the invention.
Figure 15:
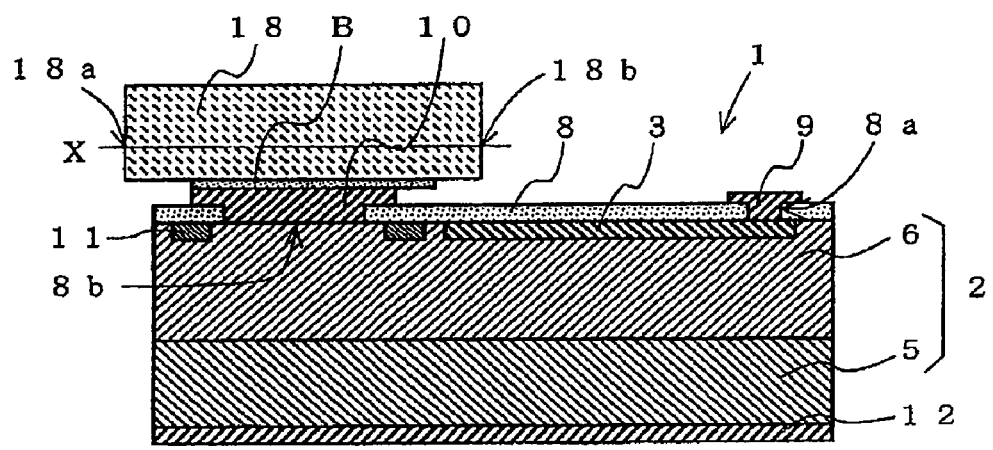
FIG. 15 is a sectional view along line V-V of the photonic semiconductor device shown in FIG. 14.

FIG. 14 is a plan view of the photonic semiconductor device of, and FIG. 15 is a sectional view along line V-V of the photonic semiconductor device shown in FIG. 14.

In the light-receiving element 1 shown in FIG. 15, an n-type low concentration impurity layer ($n^-$ layer) 6 is laid on top of an n-type high concentration impurity layer ($n^+$ layer) 5 diffused with an n-type impurity such as a phosphorus to form a silicon substrate (semiconductor substrate) 2, and, just below the top surface of part of the silicon substrate 2, a high concentration impurity layer ($p^+$ layer) 3 doped with a p-type impurity such as boron is formed to form a PIN-type light-receiving element. Needless to say, a PN-type light-receiving element may be formed instead, or the completely opposite combination of p- and n-type conductivity may be used. Here, the portion where the p-type impurity layer 3 is formed functions as a light-receiving region 4 (shown in FIG. 14). As will be clear from FIG. 14, in the photonic semiconductor device shown in FIG. 15, part of a side edge of the light-receiving region 4 is extended to form a projecting portion 4a.

On the other hand, on the top surface of the silicon substrate 2, an insulating film 8 of silicon oxide or the like is formed for surface protection and reflection prevention. To extract a signal from the light-receiving region 4, a through hole 8a is formed in the insulating film 8 above the light-receiving region 4, then a metal such as aluminum is vapor-deposited on top, and then the unnecessary portion of the metal is removed by photolithography to form a signal electrode 9 that makes contact with the p-types impurity layer 3. In a similar manner, a mount electrode 10 is formed on the insulating film 8. On the bottom surface of the silicon substrate 2, a bottom surface electrode 12 of gold or the like is formed.

Then, on the mount electrode 10 thus formed on the light-receiving element 1, a light-emitting element 18 is fixed with a conductive adhesive B such as Ag paste. The light-emitting element 18 is a side-emission-type semiconductor laser element that has light-emitting points 18a and 18b located on its right and left side surfaces in FIG. 15 and that has an active layer laid close to its bottom for maximum heat rejection. In this example, the light-emitting element 18 has positive and negative surface electrodes arranged on its top and bottom surfaces.

Figure 18:
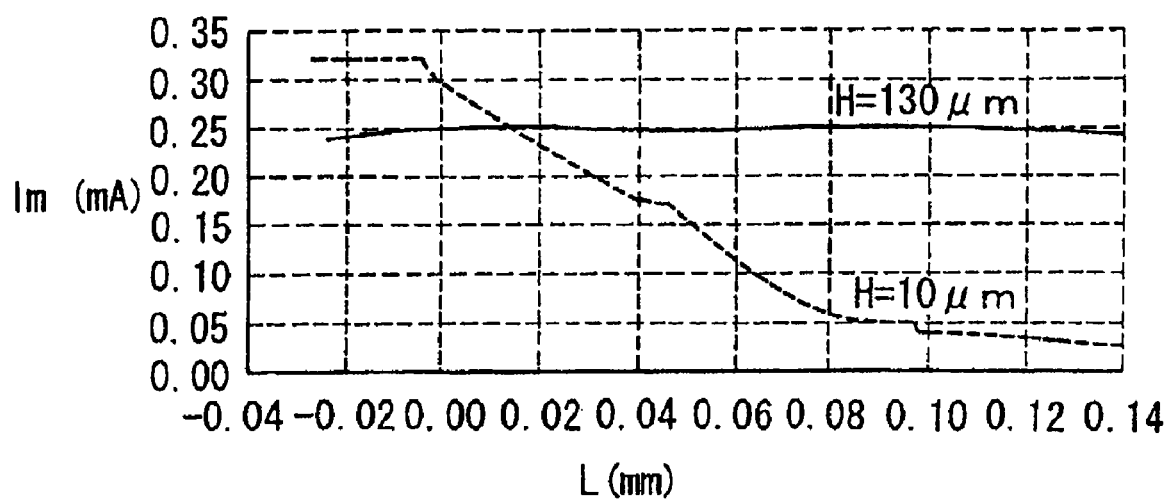
FIG. 18 is a diagram showing the relationship between the distance from the light-emitting element and the output current of the light-receiving element at different heights of the light-emitting point of the light-emitting element.

One important feature here is that, when the photonic semiconductor device is viewed in a plan view, the light-emitting point 18b of the light-emitting element 18 overlaps with the projecting portion 4a of the light-receiving region 4. With this structure, even if the position in which the light-emitting element 18 is fitted varies slightly, it is possible to keep L=0 in FIG. 18, that is, it is possible to receive light from the light-emitting point with high sensitivity.

Another important feature is that a high concentration impurity layer 11 having an impurity concentration as high as or higher than that of the p-type high concentration impurity layer 3 is formed below the top surface of the silicon substrate 2 along the peripheral edges of the mount electrode 10 in such a way that, when viewed in a plan view, the high concentration impurity layer 11 partially overlaps with the mount electrode 10. This high concentration impurity layer 11 is formed by selectively diffusing an n-type impurity such as phosphorus. The conductivity type of this high concentration impurity layer 11 may be either p- or n-type.

This high concentration impurity layer 11 is located between the light-receiving region 4 and the mount electrode 10, and effectively absorbs the unwanted electric charge produced in the silicon substrate 2 by the voltage applied to the mount electrode 10. This helps minimize the adverse effect on the illuminance-to-output current characteristic of the light-receiving element 1. Accordingly, the distance between the light-receiving region 4 and the mount electrode 10 can be made shorter than where the high concentration impurity layer 11 is not formed. This helps miniaturize the device.

Still another important feature is that, now that the high concentration impurity layer 11 is formed below the top surface of the silicon substrate 2, to secure a sufficient overlap between the projecting portion 4a of the light-receiving region 4 and the light-emitting point 18b of the light-emitting element 18, a recessed portion 10a is formed at the side of the mount electrode 10 facing the projecting portion 4a of the light-receiving region 4. As a result, when viewed in a plan view, the recessed portion 10a of the mount electrode 10 fits into the projecting portion 4a of the light-receiving region 4, and thus the light-emitting point 18b located at the center of the rear surface of the light-emitting element 18 is located above the projecting portion 4a. This makes it possible to receive the light from the light-emitting point 18b with high sensitivity.

A further important feature is that the mount electrode 10 is formed above a through hole 8b formed in the insulating film 8 so that the greater part of the mount electrode 10 makes direct contact with the silicon substrate 2. As described earlier, this structure, compared with a structure in which the mount electrode 10 is formed simply on top of the insulating film 8, enhances the heat rejection characteristic of the light-emitting element 18.

Moreover, by optimizing the resistance of the silicon substrate 2, even when an unwanted high voltage such as a surge is applied to the light-emitting element 18, it is possible to make the mount electrode 10 and the silicon substrate 2 function as a discharge path of such a voltage. This increases the electrostatic withstand voltage of the light-emitting element 18.

Figure 16:
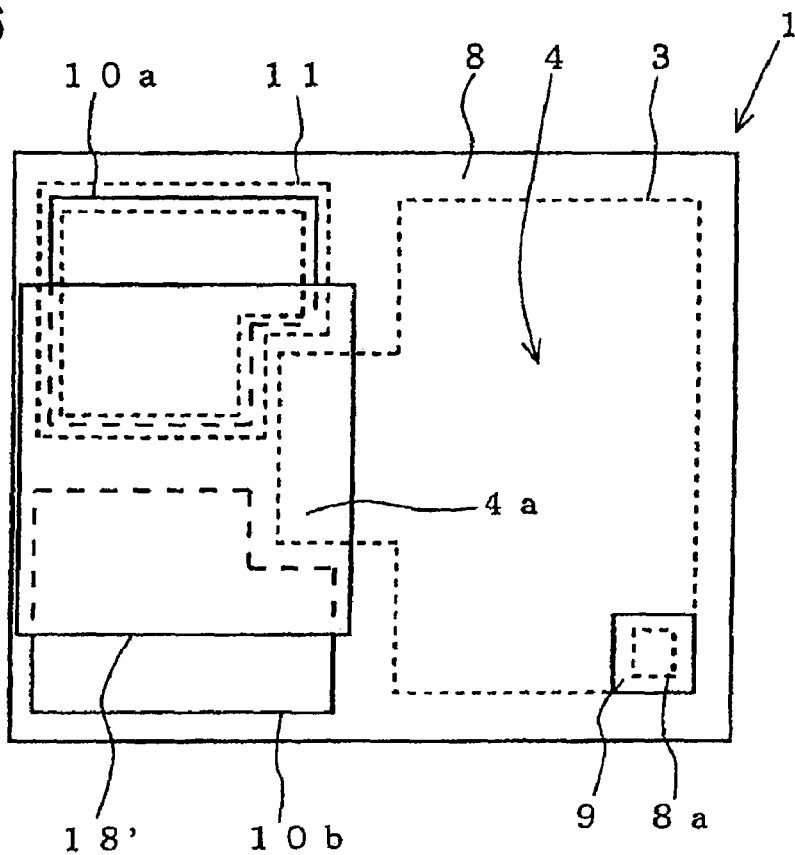
FIG. 16 is a plan view showing the photonic semiconductor device of claim 11 incorporating a light-emitting element having two surface electrodes on the same side.
Figure 17:
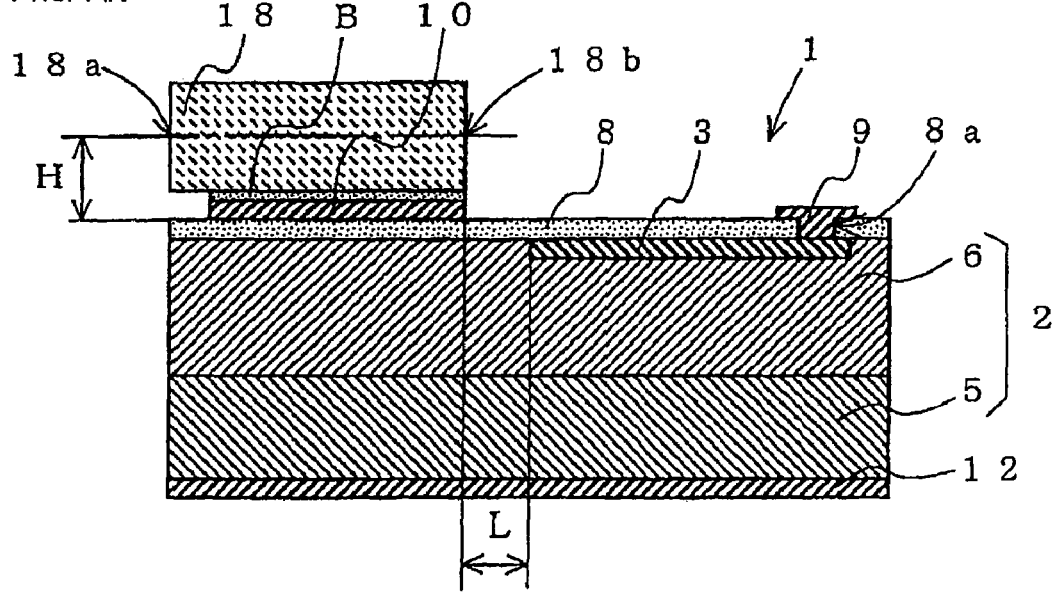
FIG. 17 is a vertical sectional view showing an example of a conventional photonic semiconductor device.

Next, a description will be given of a case where a light-emitting element that has two surface electrodes on the same side is used. FIG. 16 is a plan view of a photonic semiconductor device incorporating a light-emitting element having two surface electrodes on the same side. This photonic semiconductor device differs from that shown in FIG. 15 in that two mount electrodes are formed on top of the insulating layer, and in other respects these two devices have basically the same structure.

In FIG. 16, the light-receiving region 4 has a rectangular shape, with a projecting portion 4a formed so as to extend leftward from a central portion of its left side. On the other hand, of the two mount electrodes 10a and 10b formed on top of the insulating film 8, one (first mount electrode) 10a is formed above a through hole 8b formed in the insulating film 8, and has a rectangular shape of which the portion (lower right corner) facing the projecting portion 4a of the light-receiving region 4 is cut off; the other (second mount electrode) 10b also has a rectangular shape of which the portion (upper right corner) facing the projecting portion 4a of the light-receiving region 4 is cut off In addition, a high concentration impurity layer 11 as described earlier is formed below the top surface of the silicon substrate 2 along the peripheral edges of the first mount electrode 10a, and this high concentration impurity layer 11 also has a rectangular shape of which the portion (lower right corner) facing the projecting portion 4a of the light-receiving region 4 is cut off. A light-emitting element 18' is fitted with a conductive adhesive (not shown) so that its two surface electrodes 181 and 182 make contact with the first and second mount electrodes 10a and 10b, respectively.

With this structure, even when a light-emitting element 18' having two surface electrodes 181 and 182 on the same side is used, it is possible to secure a sufficient overlap between the projecting portion 4a of the light-receiving region 4 and the light-emitting point 18b of the light-emitting element 18', and thus it is possible to receive the light from the light-emitting point 18b with high sensitivity.

The structures shown in FIGS. 8, 11, and 13 can be adopted also when the photonic semiconductor device of the second embodiment described above is mounted on a semiconductor laser device or the like. To prevent destruction of the light-emitting element by a surge, it is advisable to adopt the wiring shown in FIG. 11 or 13.

INDUSTRIAL APPLICABILITY

In the light-receiving element of the present invention, and in the photonic semiconductor device employing it, the output of the light-receiving element is not influenced by the voltage applied to the electrode on which the light-emitting element is mounted or by a similar factor. Moreover, the light-emitting element is protected from destruction by static electricity during fabrication.

Moreover, by arranging the light-emitting element in such a way that, when viewed in a plan view, its light-emitting point overlaps with at least part of the light-receiving region, the light-emitting element can be fitted easily even when it has a low light-emitting point. This helps reduce variation in light reception sensitivity.

The invention claimed is:

1. A light-receiving element having a photodiode formed in part of a top surface of a semiconductor substrate so as to function as a light-receiving region and having a light-emitting element mount electrode formed on top of the semiconductor substrate where the light-receiving region is not formed, wherein a strip-shaped high concentration impurity layer is formed below the top surface of the semiconductor substrate substantially along peripheral edges of the light-emitting element mount electrode in such a way that, when viewed in a plan view, there is either a partial or no overlap between the high concentration impurity layer and the light-emitting element mount electrode.

2. A light-receiving element as claimed in claim 1, wherein an insulating layer is formed on the top surface of the semiconductor substrate both where the light-receiving region is formed and where the light-receiving region is not formed, and the light-emitting element mount electrode is formed on top of the insulating layer.

3. A light-receiving element as claimed in claim 2, wherein the light-emitting element mount electrode is formed above a through hole formed in the insulating layer, and the electrode makes direct contact with the semiconductor substrate through the through hole.

4. A light-receiving element having a photodiode formed in part of a top surface of a semiconductor substrate so as to function as a light-receiving region and having a light-emitting element mount electrode formed on top of the semiconductor substrate where the light-receiving region is not formed, wherein the light-emitting element mount electrode is formed so as to make contact with a low concentration impurity layer of the photodiode, and a strip-shaped high concentration impurity layer is formed below the top surface of the semiconductor substrate substantially along peripheral edges of the light-emitting element mount electrode.

5. A light-receiving element as claimed in claim 4,
wherein an insulating layer is formed on the top surface of the semiconductor substrate both where the light-receiving region is formed and where the light-receiving region is not formed, and the light-emitting element mount electrode makes contact with the low concentration impurity layer through a through hole formed in the insulating layer.

6. A light-receiving element as claimed in one of claims 1 to 5,
wherein the high concentration impurity layer is formed only along the edge facing the light-receiving region.

7. A photonic semiconductor device as claimed in claim 5,
wherein an insulating layer is formed on the top surface of the semiconductor substrate both where the light-receiving region is formed and where the light-receiving region is not formed, the light-emitting element mount electrode is formed above a through hole formed in the insulating layer, and the electrode makes direct contact with the semiconductor substrate through the through hole.

8. A photonic semiconductor device having a photodiode formed in part of a top surface of a semiconductor substrate so as to function as a light-receiving region, having a light-emitting element mount electrode formed on top of the semiconductor substrate where the light-receiving region is not formed, and having a light-emitting element mounted on the light-emitting element mount electrode,
wherein a strip-shaped high concentration impurity layer is formed below the top surface of the semiconductor substrate substantially along peripheral edges of the light-emitting element mount electrode in such a way that, when viewed in a plan view, there is either a partial or no overlap between the high concentration impurity layer and the light-emitting element mount electrode.

9. A photonic semiconductor device having a photodiode formed in part of a top surface of a semiconductor substrate so as to function as a light-receiving region, having a light-emitting element mount electrode formed on top of the semiconductor substrate where the light-receiving region is not formed, and having a light-emitting element mounted on the light-emitting element mount electrode,
wherein the light-emitting element mount electrode is formed so as to make contact with a low concentration impurity layer of the photodiode, and a strip-shaped high concentration impurity layer is formed below the top surface of the semiconductor substrate substantially along peripheral edges of the light-emitting element mount electrode.

10. A photonic semiconductor device as claimed in claim 9,
wherein an insulating layer is formed on the top surface of the semiconductor substrate both where the light-receiving region is formed and where the light-receiving region is not formed, and the light-emitting element mount electrode makes contact with the low concentration impurity layer through a through hole formed in the insulating layer.

11. A photonic semiconductor device as claimed in one of claims 7 to 10,
wherein the light-receiving region is formed parallel to a direction in which the light-emitting element emits light, and the light-emitting element is arranged in such a way that, when viewed in a plan view, a light-emitting point thereof overlaps with at least part of the light-receiving region.

12. A photonic semiconductor device as claimed in claim 11,
wherein the light-emitting element is a semiconductor laser.

13. A photonic semiconductor device as claimed in claim 11,
wherein a height from a top surface of the light-receiving element to the light-emitting point of the light-emitting element is 120 μm or less.

14. A photonic semiconductor device having an insulating layer formed on top of a semiconductor substrate, having a photodiode formed in part of a top surface of the semiconductor substrate so as to function as a light-receiving region, having a through hole formed in the insulating layer where the light-receiving region is not formed, having a light-emitting element mount electrode formed so as to make direct contact with the semiconductor substrate through the through hole, having a light-emitting element mounted on the light-emitting element mount electrode, and having a strip-shaped high concentration impurity layer formed below the surface of the semiconductor substrate substantially along peripheral edges of the light-emitting element mount electrode,
wherein a resistance of the semiconductor substrate is higher than an operating-state resistance of the light-emitting element, and, of two surface electrodes formed on the light-emitting element, the surface electrode that does not make contact with the light-emitting element mount electrode is kept at an identical potential with a bottom surface electrode of the semiconductor substrate.

15. A photonic semiconductor device having an insulating layer formed on top of a semiconductor substrate, having a photodiode formed in part of a top surface of the semiconductor substrate so as to function as a light-receiving region, having a through hole formed in the insulating layer where the light-receiving region is not formed, having a light-emitting element mount electrode formed so as to make direct contact with the semiconductor substrate through the through hole, having a light-emitting element mounted on the light-emitting element mount electrode, having the light-receiving region of the light-receiving element formed parallel to a direction in which the light-emitting element emits light, and having the light-emitting element arranged in such a way that, when viewed in a plan view, a light-emitting point thereof overlaps with at least part of the light-receiving region,
wherein a resistance of the semiconductor substrate is higher than an operating-state resistance of the light-emitting element, and, of two surface electrodes formed on the light-emitting element, the surface electrode that does not make contact with the light-emitting element mount electrode is kept at an identical potential with a bottom surface electrode of the semiconductor substrate.

16. A photonic semiconductor device as claimed in claim 14 or 15, wherein the resistance of the semiconductor substrate is in a range of from 50 or 15,000Ω.

* * * * *